TRANSISTORIZED MONOSTABLE MULTIVIBRATOR WITH
IMPROVED TIMING AND NOISE REJECTION
Filed April 20, 1965
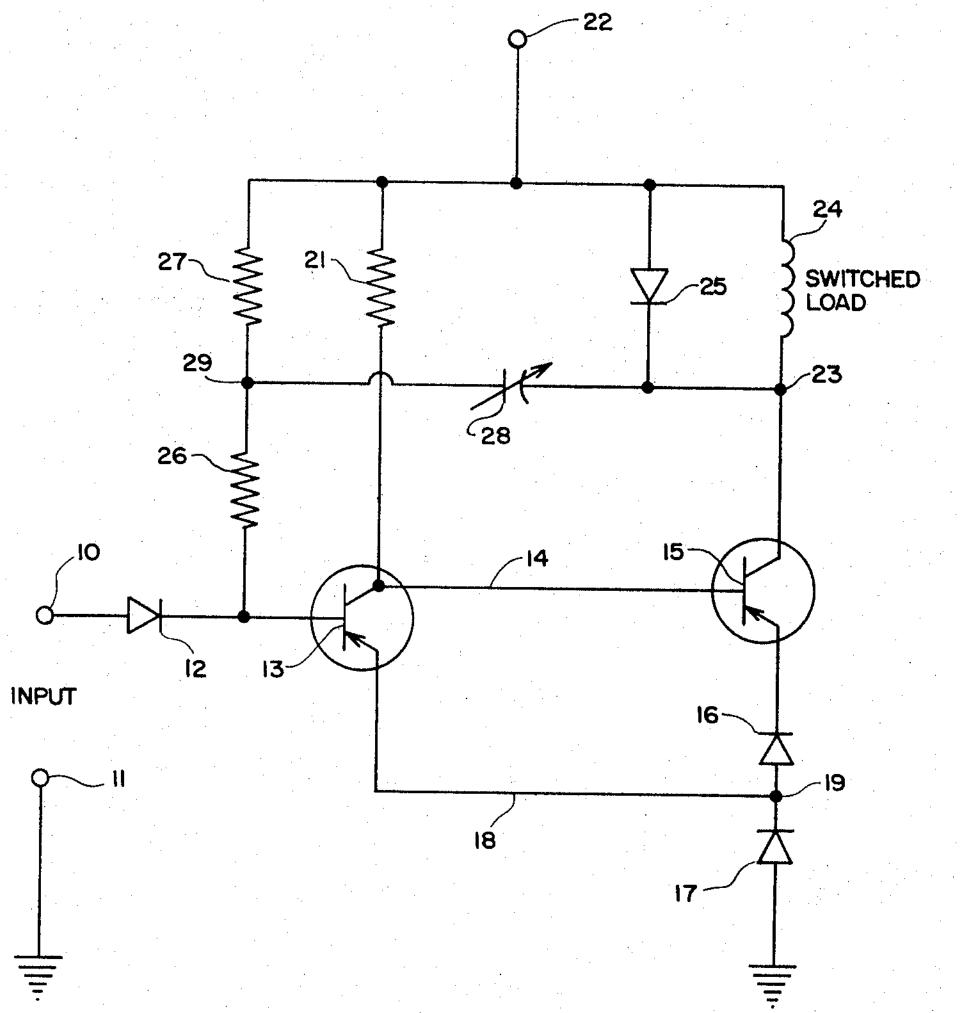
INVENTOR.
MARVIN E. LYLES
WARREN L. CHILDS
BY Samuel B. Stone

United States Patent Office 3,374,365
Patented Mar. 19, 1968

3,374,365

TRANSISTORIZED MONOSTABLE MULTIVIBRATOR WITH IMPROVED TIMING AND NOISE REJECTION

Marvin E. Lyles, Garden Grove, and Warren L. Childs, Ontario, Calif., assignors to Beckman Instruments, Inc., a corporation of California Filed Apr. 20, 1965, Ser. No. 449,441
7 Claims. (Cl. 307—273)

ABSTRACT OF THE DISCLOSURE

A monostable multivibrator employing a voltage dividing network in conjunction with a capacitor for stabilizing the RC circuit timing and a pair of series connected diodes, one common to both transistors, for establishing the switching threshold of the circuit.

This invention relates to an electronic switch and more particularly to an electronic switch having a controllable hold-in time.

Frequently it is desirable to utilize an electronic switch which has a predetermined, or variable, hold-in time as well as a predetermined threshold level for discriminating against extraneous input signals of input noise. Typical circuitry for accomplishing these objectives may include a combination of a Schmitt trigger and a monostable multivibrator wherein a predetermined threshold level is provided by the Schmitt trigger and a variable hold-in time is provided by the one-shot multivibrator. In such circuitry, and similar circuitry, the threshold level frequently is determined by a resistance or voltage divider which may have a variable current thereby not providing a fixed threshold level for both turn-on and turn-off. Additionally, such circuits generally include a relatively large number of components for accomplishing these objectives and render the circuits complex and costly.

Accordingly, it is an object of the present invention to provide an electronic switch which has a predetermined hold-in time as well as a predetermined threshold level and which employs fewer components than prior circuits for providing similar functions.

It is an additional object of the present invention to provide an electronic switch providing the threshold sensitive feature of a Schmitt trigger circuit and the predetermined, or variable, hold-in time feature of a monostable multivibrator.

It is a further object of the present invention to provide an improved electronic switch having relatively few components and which provides a fixed threshold and a predetermined, or variable, hold-in time.

In accordance with a specific exemplary embodiment of the teachings of the present invention, an electronic switch is provided utilizing a pair of switching semiconductors which are operated to switch a current between alternate paths, with one of the paths including a load. An input threshold level is determined by a predetermined fixed voltage drop. In the embodiment shown and described herein, this voltage drop is provided by the drop across a semiconductor diode and the diode voltage drop across a junction of the input transistor. The input transistor is directly coupled to drive a second transistor which is in the load current path. Feedback to the input of the input transistor is provided by means of a capacitor, with the hold-in time of the switch being determined by this capacitor and an associated resistance. An electronic switch constructed in accordance with the teachings of the present invention provides a predetermined, or variable as desired, hold-in time, as well as a predetermined constant threshold level for discriminating against input noise.

This is accomplished with a minimum number of components. The turn-on voltage is substantially identical to the turn-off voltage. The electronic switch is adaptable to drive either inductive or resistive loads.

Other objects and features of the invention will be apparent from a consideration of the specification taken in conjunction with the drawing, the single figure of which discloses an electronic switch constructed in accordance with the teachings of the present invention.

Referring now to the drawing, input terminals 10 and 11 are provided for connecting the switch of the present invention to other circuitry or apparatus (not shown) which supplies a pulse to which the present switch responds. Input terminal 11 may be connected to ground. Input terminal 10 is connected through a gating diode 11, which may be a germanium diode, to the base of a PNP transistor 13, which may be a germanium transsitor. The diode 12 discriminates against negative input pulses. The collector of the transistor 13 is directly connected through a lead 14 to the base of a PNP transistor 15, preferably of silicon. The emitter of the transistor 15 is connected through diodes 16 and 17, which may be silicon diodes, to ground. The emitter of the transistor 13 is connected through a line 18 to a common point 19 between the diodes 16 and 17. The input threshold trigger level is determined by the voltage drop across the diode 17 in combination with the diode voltage of the base-emitter junction of the transistor 13.

The collector of the transistor 13 is connected through a resistance 21 to a terminal 22 which is adapted to be connected to a source of negative voltage, such as thirty volts. The collector of the transistor 15 is connected to a terminal 23 and through a load 24, which is indicated as an inductive load, to the terminal 22. A germanium diode 25 is connected in parallel with the load 24. It should be noted that if the load 24 is resistive, it is not necessary to employ the diode 25 in parallel therewith.

The base of the transistor 13 is connected through a voltage divider comprising resistances 26 and 27 to the terminal 22. The collector of the transistor 15 is connected through a capacitance 28, illustrated as a variable capacitance in order to select the hold-in time, to a common junction 29 between the resistances 26 and 27. The time constant of the capacitance 28 in combination with the resistance 27 determines the hold-in time of the electronic switch, for example, up to one minute. The resistance 26 prevents the circuit from triggering as a result of power supply noise.

In the absence of a positive input pulse of sufficient amplitude, the electronic switch is in a quiescent state with the transistor 13 on and the transistor 15 off. In this case, a current path exists from ground through the diode 17, which is now forward biased, the line 18, the emitter-collector circuit of the transistor 13 and the resistance 21 to the terminal 22. The voltage drop across the emitter-collector circuit of the transistor 13 is typically around .1 of a volt; whereas, the voltage drop across the emitter-base circuit of the transistor 15 is approximately .6 of a volt and the voltage drop across the diode 16 is approximately .6 of a volt. Accordingly, the base of the transistor 15 is not now sufficiently negative with respect to its emitter and this transistor is held off.

The voltage drop across the base-emitter junction of the transistor 13 is typically approximately .2 of a volt. The capacitor 28 charges with the right plate being negative with respect to the left plate thereof. For example, assuming a 30-volt negative power supply being connected between the terminal 22 and ground (with the terminal 22 negative), the right-hand plate of the capacitor 28 is at approximately 30 volts negative, and the left-hand plate of the capacitor is at a less negative voltage determined by the relative values of the resistances 26 and 27. Assuming that the resistances 26 and 27 are equal for purposes of explanation, the point 29 (and thus the left-hand plate of the capacitor 28) is at a negative voltage of approximately 15 volts. Therefore, the left plate is positive with respect to the right plate and the charge stored is approximately 15 volts.

Upon the occurrence of a positive input pulse sufficient to overcome the base-emitter drop of the transistor 13 (such as approximately .3 to .5 of a volt positive) the transistor 13 is turned off. The transistor 15 now turns on inasmuch as the current through the resistance 21 decreases thereby reducing the voltage across the resistance 21 and causing the base of the transistor 15 to go sufficiently negative with respect to the emitter thereof. Current now exists in the path including the diodes 17 and 16, the emitter-collector circuit of the transistor 15 and the load 24 to the terminal 22. The junction 23 between the collector of the transistor 15 and the load 24 is now essentially connected to ground (actually it is slightly more negative than ground because of the voltage drops through the transistor 15 and the diodes 16 and 17, but these drops will not be considered in order to simplify the explanation of the operation of the circuit). The point 29 between the resistances 26 and 27 momentarily goes to approximately 15 volts positive (still assuming these resistances are equal). This is true because (a) the point 29 is now floating (the transistor 15 is off), (b) the capacitor 28 was charged to approximately 15 volts with the left plate being positive with respect to the right plate, and (c) the right plate of the capacitor 28, which is connected to the point 23, is now substantially at ground. Thus, considering the series circuit from ground through the diodes 17 and 16, the emitter-collector path of the transistor 15, the capacitor 28, and the resistance 27 to the terminal 22 (considered at 30 volts negative for illustration), the left-hand plate of the capacitor 28 is now at 15 volts positive with respect to ground (again ignoring the voltage drops of the diodes 17 and 16 and the emitter-collector path of the transistor 15). The point 29 tends to go toward 30 volts negative as the charge on the capacitor 28 changes at a rate determined by the time constant of the resistance 27 in combination with the capacitor 28. When the point 29 goes sufficiently negative (slightly more negative than the .2-volt drop across the base-emitter junction of the transistor 13), the transistor 13 again turns on.

When the transistor 13 turns on, the base of the transistor 15 is no longer sufficiently negative with respect to the emitter thereof, and this latter transistor turns off. It should be noted that the saturation resistance of the transisor 13 is low and the voltage drop across the emitter-collector circuit is approximately .1 volt, and the voltage drop across the emitter-base junction of the transistor 15 is approximately .6 volt. In order to aid in turning off the transistor 15, and in holding this transistor off, the diode 16 is provided which has a further voltage drop of approximately .6 volt. Hence, the inclusion of the diode 16 effectively increases the voltage (negative at the base of the transistor 15 with respect to the point 19) required for turning on the transistor 15.

Typical components which have been found suitable for use in an electronic switch constructed in accordance with the teachings of the present invention are as follows:

Diode 12—germanium diode 1N270.
Transistor 13—germanium transistor 2N1309.
Transistor 15—silicon transistor 2N1131.
Diodes 16 and 17—silicon diodes.
Resistance 21—500 ohms, 5 watts.
Load 23—stepping switch coil.
Diode 24—germanium diode 1N1612.
Resistance 26—3K ohms.
Resistance 27—10K ohms.
Capacitance 28—200 microfarads.

It will be apparent that the present invention provides an improved electronic switch employing relatively few components. Current is switched between one of two paths to control a load in one of these paths. Diodes are utilized for providing fixed voltage drops to control the turn-on threshold of transistors in the respective current paths. Feedback is provided from the load circuit path to the input circuit, and the feedback circuitry has a predetermined, or variable if desired, time constant for setting the hold-in time of the electronic switch.

Although particular components and values have been discussed in connection with a specific embodiment of an electronic switch constructed in accordance with the teachings of the present invention, others may be utilized. Furthermore, it will be understood that although an exemplary embodiment of the present invention has been disclosed and discussed, other arrangements are possible and that the embodiment disclosed may be subjected to various changes, modifications and substitutions without necessarily departing from the spirit of the invention.

What is claimed is:

1. An electronic switch having input terminals for receiving a pulse and switching a current through a load, and including first and second source terminals adapted to be connected to a source of voltage with the first of said source terminals being connected to a first input terminal and serving as a reference terminal, the improvement comprising:
   - a first semiconductor having first, second and third electrodes, and means connecting a second input terminal to a first electrode of said semiconductor,
   - a second semiconductor having first, second and third electrodes, and means connecting the second electrode of said first semiconductor with the first electrode of said second semiconductor,
   - first and second unilaterally conductive devices connected in series between the third electrode of said second semiconductor and said reference terminal,
   - said load being connected between said second electrode of said second semiconductor and said second source terminal,
   - the third electrode of said first semiconductor being connected to a junction between said first and second unilaterally conductive devices,
   - a voltage divider having end terminals and an intermediate point, with the end terminals being connected between the first electrode of said first semiconductor and said second source terminal,
   - an impedance connected between the second electrode of said first semiconductor and said second source terminal, and
   - a capacitance connected between the junction of the second electrode of said second semiconductor and said load and said point on said voltage divider.

2. A switch as in claim 1 wherein:
   - said second electrode of said first semiconductor and said first electrode of said second semiconductor are directly connected,
   - said first semiconductor is a germanium transistor, and said second semiconductor is a silicon transistor.

3. A switch as in claim 2 wherein:
   - said first and second unilaterally conductive devices are silicon diodes.

4. A switch as in claim 3 wherein:
   - said load is an inductive load,
   - a unilaterally conductive device is connected in parallel with said load, and
   - a unilaterally conductive device is connected between said second input terminal and said first electrode of said first semiconductor.

5. An electronic switch responsive to an input pulse for directing a current from a first path to a second path, said second path including a load, the improvement comprising:
   - a first transistor having three electrodes, with two of said electrodes being connected in series with a resistance in said first current path, a second transistor having three electrodes, with two of its electrodes connected in series with a first diode and said load, a second diode directly connected to said first diode and common to both of said current paths, a voltage divider, a capacitor connected from the junction of an electrode of said second transistor and said load in said second current path to an intermediate terminal on said voltage divider, one terminal of said voltage divider being connected to another of said electrodes of said first transistor, which latter electrode is arranged to switch said first transistor from one of the two conductive states of saturation or cut-off to another responsive to an input pulse, another terminal of said voltage divider being connected to a terminal common to both of said current paths and adapted to be connected to a source of voltage, and means connecting the junction between said first transistor and the resistance in series therewith to another of said electrodes of said second transistor, which latter electrode is arranged to switch said second transistor from one of said conductive states to another.

6. A switch as in claim 5 wherein:

said first transistor is a germanium transistor, said second transistor is a silicon transistor, and said diode are silicon diodes.

7. A switch as in claim 5 wherein:

said capacitor is variable, and the hold in time of said switch is determined by the time constant of said capacitor and a portion of said voltage divider.

References Cited

UNITED STATES PATENTS

| | | | |
|---|---|---|---|
| 3,068,406 | 12/1962 | Dellinger | 307—88.5 X |
| 3,078,371 | 2/1963 | Mohring | 307—88.5 X |
| 3,089,962 | 5/1963 | Foote | 307—88.5 |
| 3,130,327 | 4/1964 | Krossa et al. | 307—88.5 |
| 3,158,751 | 11/1964 | Nelson | 307—88.5 |
| 3,183,366 | 4/1965 | Brode | 307—88.5 |
| 3,194,977 | 7/1965 | Anzalone et al. | 307—88.5 |
| 3,213,297 | 10/1965 | Greene | 307—88.5 |
| 3,214,644 | 10/1965 | McCoy | 317—148.5 |
| 3,278,756 | 10/1966 | Weber | 307—88.5 |
| 3,289,170 | 11/1966 | Currey et al. | 307—88.5 X |

ARTHUR GAUSS, *Primary Examiner.*

J. JORDAN, *Assistant Examiner.*

DAVID J. GALVIN, *Examiner.*